(12) United States Patent
Chan

(10) Patent No.: US 9,032,266 B2
(45) Date of Patent: May 12, 2015

(54) MULTITHREADED, MIXED-HDL/ESL CONCURRENT FAULT SIMULATOR FOR LARGE-SCALE INTEGRATED CIRCUIT DESIGNS

(76) Inventor: Terence Wai-Kwok Chan, Dublin, CA (US)

( * ) Notice: Subject to any disclaimer, the term of this patent is extended or adjusted under 35 U.S.C. 154(b) by 138 days.

(21) Appl. No.: 13/525,342

(22) Filed: Jun. 17, 2012

(65) Prior Publication Data

US 2013/0007549 A1    Jan. 3, 2013

Related U.S. Application Data

(60) Provisional application No. 61/502,284, filed on Jun. 28, 2011.

(51) Int. Cl.
| | |
|---|---|
| *G06F 11/00* | (2006.01) |
| *G01R 31/28* | (2006.01) |
| *G06F 17/50* | (2006.01) |
| *G06F 11/26* | (2006.01) |

(52) U.S. Cl.
CPC .......... *G06F 17/5022* (2013.01); *G06F 17/505* (2013.01); *G06F 11/261* (2013.01)

(58) Field of Classification Search
None
See application file for complete search history.

(56) References Cited

U.S. PATENT DOCUMENTS

| | | | | |
|---|---|---|---|---|
| 3,775,598 A | * | 11/1973 | Chao et al. | 714/33 |
| 5,184,308 A | * | 2/1993 | Nagai et al. | 703/15 |
| 5,513,339 A | * | 4/1996 | Agrawal et al. | 703/15 |
| 5,633,812 A | * | 5/1997 | Allen et al. | 703/15 |
| 6,370,492 B1 | * | 4/2002 | Akin | 703/13 |
| 6,466,898 B1 | * | 10/2002 | Chan | 703/17 |
| 7,315,802 B1 | * | 1/2008 | Jenkins, IV | 703/14 |
| 7,389,453 B2 | * | 6/2008 | Udell | 714/724 |
| 7,827,017 B2 | * | 11/2010 | Kundert | 703/14 |
| 7,886,251 B2 | * | 2/2011 | Wen et al. | 716/100 |
| 8,418,012 B2 | * | 4/2013 | Blostic et al. | 714/741 |
| 8,516,454 B2 | * | 8/2013 | Mizrachi et al. | 717/140 |
| 2003/0005416 A1 | * | 1/2003 | Henftling et al. | 717/129 |
| 2005/0209840 A1 | * | 9/2005 | Baklashov et al. | 703/22 |
| 2007/0094561 A1 | * | 4/2007 | Udell et al. | 714/738 |
| 2010/0174520 A1 | * | 7/2010 | Kojima | 703/14 |
| 2012/0239993 A1 | * | 9/2012 | Chung | 714/727 |

* cited by examiner

*Primary Examiner* — Daniel McMahon

(57) ABSTRACT

An advanced fault simulator that can audit the fault coverage of large-scale integrated circuit (IC) designs is described herein. Specifically, an IC design's Hardware Description Language and/or Electronic System-Level source files are compiled into a database, stuck-at, transition and/or inter-process communication faults for the design are generated and equivalent faults are collapsed. Furthermore, all faults are partitioned into disjointed fault sets, and a set of worker threads are created to process those fault sets concurrently. The worker threads can run either locally on a multiprocessor platform, or remotely on different computers that are connected via an intranet and/or the Internet. Moreover, each worker thread can create a plurality of child threads to further accelerate the multithreaded concurrent fault simulation of the IC design. After the simulation is finished, a fault report is generated that depicts the fault coverage of the IC design and all undetected and detected faults.

29 Claims, 3 Drawing Sheets

```
SA1      top.modB.*;
SA0      top.*;
TRAN  2ns,1ns  top.modA.d, top.sigA;
STROBE:   out1, out2, out3;
```

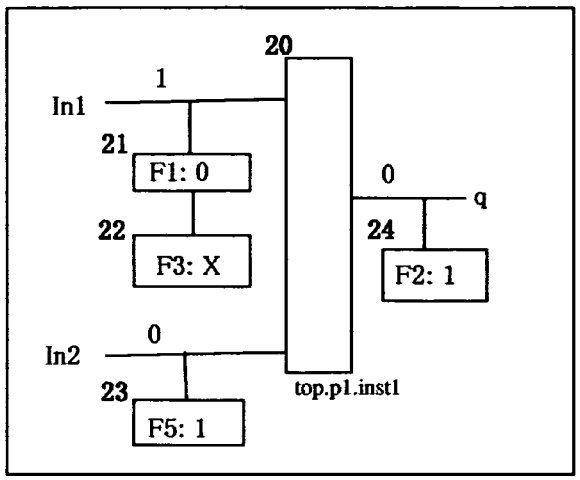

Figure 5

```
v2Fault™- v6.0.94 (8 CPU/64-bit) Dynetix Design Solutions Inc. All rights reserved.

Top Module:                        top
Total signals:                     2483
Total toggle to 0:                 2483 (100%)
Total toggle to 1:                 2467 (99.36%)
Total stuck-at-0 faults:           2528
Total stuck-at-1 faults:           1584
Total transition faults:           1130
Total SA0 collapsed:               1
Total SA1 collapsed:               961
Total transition faults collapsed: 0
Total faults:                      5242
Total detected:                    5139
Fault Coverage:                    98.04
Undetected Faults
SA1        top.modA.inst1.strobe
TRANS      top.k1.p1
```

Figure 6

MULTITHREADED, MIXED-HDL/ESL CONCURRENT FAULT SIMULATOR FOR LARGE-SCALE INTEGRATED CIRCUIT DESIGNS

1. INTRODUCTION

This applicant claims priority based on provisional patent application No. 61/502,284 as filed on Jun. 28, 2011.

With the rapid advance of deep submicron process technologies and ever shrinking integrated circuit time-to-market window, most advanced large-scale integrated circuit (IC) designs such as system-on-chip (SoC), application specific integrated circuit (ASIC), field programmable gate-array (FPGA) and custom IC designs now contain billions of transistors, and the testing time of these advanced IC designs could take days or weeks to complete.

Automatic test pattern generation (ATPG) programs are commonly used to automatically generate tests for large-scale IC designs. Fault simulators are used by ATPG programs to accelerate their performance and to reduce the size of the test patterns that they generate. Furthermore, fault simulators are also used by IC test engineers to grade test patterns that they manually generated, so as to supplement the ATPG-generated test patterns for higher fault coverage, or their ATPG programs do not support new fault models (e.g., ESL IPC faults).

Since a fault simulation run for a deep submicron IC design that contains billions of transistors may take days or weeks to complete, we have developed a set of new multithreaded concurrent fault simulation technologies that will aid a mixed-language fault simulator, which supports IC designs coded in any combination of Hardware Description Languages (HDL) and/or Electronic System-Level (ESL) languages, to drastically cut down its fault simulation time for large-scale IC designs from weeks to days. A thread is a process flow in a program that runs on a CPU (central processing unit) of a computer system. A thread in this invention may be implemented either via a POSIX thread or a UNIX process. In the following, unless explicitly state otherwise, the term "thread" will represent either a POSIX thread or a UNIX process. A multithreaded fault simulator consists of multiple threads that can carry out different fault simulation operations simultaneously on multiple CPU's. These CPU's may be located in a multiprocessor computer system, and/or they are on different computer systems that are connected via a LAN or the Internet. A multiprocessor computer system contains one or more printed circuit boards; each board hosts one or more computer chips. Each computer chip may contain multi- (multicore) or single-CPU (single-core). A multiprocessor computer system may run any operating systems, including but not limited to UNIX, Linux, Apple OS™ or Windows™.

Furthermore, our new technologies include the support of a set of novel ESL IPC fault models that no other fault simulators support. IPC faults are important for deep submicron IC designs, as undetected IPC faults could cause intermittent failures of the corresponding IC products on the field, and may render products recall. This paper will describe the advanced multiprocessing/multithreaded concurrent fault simulation technologies and the fault simulation of stuck-at, transition and IPC faults in deep submicron IC designs.

2. BRIEF DESCRIPTION OF FIGURES

FIG. 5 depicts the concurrent fault record list at the input and output pins of a design instance in an IC design.

FIG. 6 depicts a sample fault report file.

3. DESCRIPTION OF PRIOR ARTS

As depicted in Table 1, several EDA (Electronic Design Automation) vendors offer fault simulator products. However, all of those commercial fault simulators support only the Verilog hardware design language, and none of them use two-level multithreading technologies to accelerate their performance. Furthermore, there are no published commercial or academic fault simulators that support mixed-HDL/ESL languages, multi-levels multithreaded concurrent fault simulation. Finally, no fault simulators have been reported to support ESL IPC faults. Thus, the invention technologies described herein are unique and are not covered by any prior arts.

As shown in Table 1, V2Fault™ is developed based on the invention technologies, and it is the only fault simulator that supports HDL and ESL languages, and it uses two-level of parallelism to process faults in large-scale IC designs concurrently. Specifically, V2Fault™ worker processes (threads) may run on different CPU's/cores on a multiprocessor/multicore computer system, or they could run separately on remote computer systems that are connected by either a LAN or the Internet. Furthermore, each worker process activates a set of child threads dynamically for each IC instance being simulated. These threads will carry out the concurrent evaluation of faulty events for all the assigned faults of the worker process. Thus, the performance of V2Fault™ can scale according to the number of available CPU's/cores of the computer(s) that V2Fault™ is run on. Moreover, V2Fault™ is the only fault simulator to support ESL IPC faults. The IPC faults are important for ESL-based deep submicron IC designs, as they may cause intermittent failures of IC products on the fields, and no commercial ATPG programs and other fault simulators support IPC fault models currently.

TABLE 1

Comparison of Prior Arts

| Vendor | Product | HDL/ESL supports | Fault Models | Multiprocessing | Multithreaded |
|---|---|---|---|---|---|
| Silvaco Inc | HyperFault | Verilog | Stuck-at-1 Stuck-at-0 | Distributed | No |

TABLE 1-continued

Comparison of Prior Arts

| Vendor | Product | HDL/ESL supports | Fault Models | Multiprocessing | Multithreaded |
|---|---|---|---|---|---|
| Syntest Inc | TurboFault | Verilog | Stuck-at-1 Stuck-at-0 Transition Bridging | No | No |
| Cadence Design Systems Inc | VeriFault | Verilog | Stuck-at-1 Stuck-at-0 | No | No |
| WinterLogic Inc | Z01X | Verilog | Stuck-at-1 Stuck-at-0 Transition Bridging | Distributed | No |
| Dynetix Design Solutions Inc | V2Fault | Verilog SystemVerilog VHDL SystemC PSL | Stuck-at-1 Stuck-at-0 Transition IPC | Multiprocessors and/or distributed | Yes |

4. DETAILED DESCRIPTION OF THE INVENTION

Figures 1, 2:
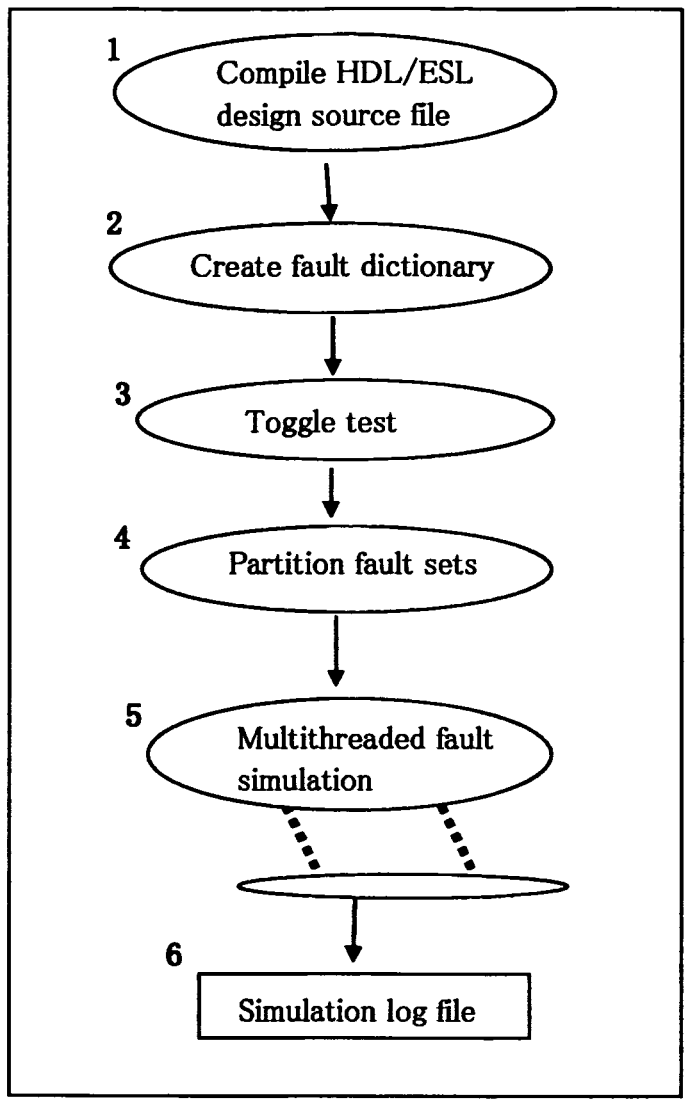
FIG. 1 shows the process flow of the multithreaded mixed-language concurrent fault simulation of an IC design.
FIG. 2 shows a sample user-defined fault configuration file. This file specifies single stuck-at-1, stuck-at-0, and transition faults for one or more signals, design instance input, inout and output pins of an IC design, as well as the fault strobe node names.

FIG. 1 depicts the process flow of a multithreaded concurrent fault simulator based on the invention technologies. Specifically, the HDL/ESL source files of an IC design under test are compiled by the fault simulator's HDL/ESL compilers into a common design database in step 1. The design source files may be coded in any combination of HDL/ESL design languages, including but not limited to SystemVerilog, VHDL, Verilog, Property Specification Language (PSL) and/or SystemC. Furthermore, the IC design may contain third-party IP (intellectual property) blocks, coded in the same or different language(s) than the main design. Moreover, the fault simulator will resolve any signal name conflicts and/or signal states mapping in design source files that are coded in different HDL/ESL languages (e.g., maps VHDL states to Verilog states for signals that are driven by VHDL design instances and are driving Verilog or SystemVerilog design instances).

After an IC design database is built, the fault simulator will generate single stuck-at-1, stuck-at-0, transition and ESL IPC faults into the design database in step 2. The faults are generated either based on a user-specified fault configuration file, or automatically by the fault simulator. Specifically, the fault simulator can automatically generate stuck-at-1, stuck-at-0 and transition faults on all signals in the design database, and generate IPC faults on all IPC objects in the design database. Alternatively, user may provide the fault simulator a fault configuration file which specifies single stuck-at-1, stuck-at-0, transition and/or IPC faults that are to be injected to specified signals, design instances' input, inout and/or output pins and/or IPC objects in the design database. Furthermore, the fault configuration file may also specify one or more fault strobe node names (signals or design instances' input, inout or output pins) where fault detection are to be checked at the end of each simulation cycle. The fault configuration file syntax is described in Section 5.1. Note that if a fault configuration file is not specified, and the IC design HDL/ESL source file does not specify any fault strobe nodes (via the $fs_strobe system task), the fault simulator will set all output ports of the IC design to be the fault strobe nodes.

Once all faults for an IC design are generated, the faults are recorded in a fault dictionary, and the fault simulator will eliminate (collapse) some of those faults based on equivalence and dominance fault collapsing methods. Furthermore, as a user-specified option, the fault simulator can run toggle test in step 3 to further collapse faults. The equivalence and dominance fault collapsing methods, and the means to collapse faults via toggle test are described in Section 5.2.

When all the aforementioned processes are completed, the fault simulator will partition the remaining faults into disjointed fault sets in step 4. The fault partitioning method is depicted in Section 5.3. Once the fault sets are defined, the fault simulator will create a plurality of worker processes (or threads) in step 5. The worker processes may run concurrently on a multiprocessor computer system, or they may run remotely on different computer systems that are connected via an intranet or the Internet. Each worker process will be assigned one or more faults sets to run concurrent fault simulation on, using user-supplied test patterns. Moreover, each worker process will in turn create a plurality of child threads to parallelize the simulation of faulty instances of the IC design under test. The concurrent fault simulation algorithm is described in Section 5.4, and the multithreaded concurrent fault simulation method is described in Section 5.5.

Finally, after all the worker processes have completed their execution, their fault simulation results are collected and a fault report file will be generated in step 6. Section 5.6 depicts the content of a fault report file.

5.1 Fault Configuration File

FIG. 2 depicts a sample fault configuration file. The configuration file is an ASCII text file that user may create using a text editor. The file may contain fault records, blank lines and/or comments. User may specify C-style block comments where each comment is enclosed by /* and */ and may span multiple physical lines. Moreover, user may specify C-style inline comments where each comment starts with the "//" characters and is terminated by a newline character. For example, below are a block comment and an inline comment:

/* this is a block comment*/
SAI top.a.F; // this is an inline comment

The fault records and their syntax that are supported in a fault configuration file are depicted in Table 2.

TABLE 2

Fault Record Syntax in a Fault Configuration File

| Fault Type | Directive Keyword | Options | Argument |
|---|---|---|---|
| Stuck-at-1 | SA1 | | object_name+ |
| Stuck-at-0 | SA0 | | object_name+ |

TABLE 2-continued

Fault Record Syntax in a Fault Configuration File

| Fault Type | Directive Keyword | Options | Argument |
|---|---|---|---|
| Transition fault | TRANS | $T_{rise}[, T_{fall}]$ | object_name+ |
| Semaphore fault | SAMAPHORE | [get/put/tryget]+ | object_name+ |
| Mutex fault | MUTEX | [lock, trylock/unlock] | object_name+ |
| FIFO fault | FIFO | [get/put/tryget]+ | object_name+ |
| Dynamic Queue fault | QUEUE | [insert/delete/push_back/ push_front]+ | object_name+ |
| Fault Strobe Node | STROBE | — | object_name+ |

Refer to Table 2, object_name may be a signal full path name, a design instance full path name and I/O pin name (delimited by '.'), or an IPC object full path name (for IPC faults). The IPC faults are semaphore, mutex, FIFO and dynamic queue faults.

One or more object_name may be specified in a fault record. Consecutive object_names are delimited by a comma. Same type of fault record may be specified multiple times (with different object_name specifications) in a fault configuration file. The transition and IPC fault models and the syntax of their respective fault records are described in Section 5.1.1 and Section 5.1.2, respectively.

The fault strobe record specifies the circuit signals and/or design instance I/O pins where fault detection is to take place. The fault strobe node(s) specified by the STROBE record will be checked at the end of each simulation cycle to see if faults are detected at these nodes. A fault is (hard) detected if its faulty states at one or more fault strobe nodes are different than that of the good (fault-free) machine, and that both the faulty states and good machine states are of logic '0' or logic '1'. A hard detected fault is recorded in the fault dictionary, and it is removed from further simulation by the fault simulator.

However, if a faulty machine's states are different than that of a good machine at one or more fault strobe nodes, and either the faulty or good machine states contain 'X' or 'Z', the corresponding fault is classified as a potentially detected fault. A potentially detected fault is recorded in the fault dictionary, but the fault simulator will continue to simulate the fault to see if the fault will be hard detected eventually.

As a user-specified option, user may specify a potentially detection threshold value P, such that if a potentially detected fault has been (potentially) detected in P simulation cycles, then the fault is classified as hard detected. This option is useful in catching hype-active faults, so as to minimize the fault simulation time and the memory usage.

Note that user may also specify fault strobe node names in their HDL/ESL source via the Verilog system task:
    $fs_strobe(object_name+);
If both the STROBE record and $fs_strobe system task are specified in a fault configuration file and an IC design source file, respectively, all those node names will be used to detect faults. Specifically, the fault strobe nodes specified via the STROBE record will be checked for fault detection at the end of every simulation cycle; whereas fault strobe nodes specified via the $fs_strobe system task are checked according to the process flow of the HDL/ESL code that invoke the system task.

If a fault configuration file is not specified, the fault simulator will automatically generate single stuck-at-1, stuck-at-0, and transition faults (with rising and falling transition delays set to 1 time step, where a time step is the smallest time resolution unit of an IC design) at every signal in the IC design under test. Also, if IPC objects are present in the design database, the fault simulator will inject IPC faults at those objects also. Furthermore, if a fault configuration file is not specified by user, or it does not contain the STROBE record, and the IC design file does not contain any $fs_strobe system task invocation, then the fault simulator will set all output ports of the IC design to be the fault strobe nodes.

5.1.1 Transition Faults

A transition fault is the added delays to a signal or a design instance I/O pin, when the signal's or the instance I/O pin's state changes from logic '0' or 'X' to logic '1' (rising transition), and/or when the signal's or design instance I/O pin's state changes from logic '1' or 'X' to logic '0' (falling transition). Transition fault models variance in signal transition delays in deep submicron IC designs that may cause the corresponding IC products to manifest intermittent failures on the field, and render products recall.

Transition faults may be specified in a fault configuration file via the TRANS fault record. The syntax of the TRANS record is:
    TRANS $T_{rise}[,T_{fall}]$object_name+';'
Where:
    $T_{rise}$ is the rising transition delay
    $T_{fall}$ is the falling transition delay
    object_name is a signal or a design instance I/O pin path name If $T_{fall}$ is not specified in a TRANS record, it is set to be the same as the $T_{rise}$ in that record. Note that $T_{rise}$ and $T_{fall}$ are natural numbers. Time units like "ms" (mini-second), "ns" (nanosecond), "ps" (picosecond) and "fs" (femtosecond) may be specified for $T_{rise}$ and/or $T_{fall}$. If no time unit is specified, a transition delay value will be set to the smallest time resolution unit of the IC design under test.

To simulate a transition fault, when the driver of a signal or design instance I/O pin changes state from logic '0' or 'X' to logic '1' at simulation time t, and there is a rising delay of $T_{delta1}$ for that object (signal or design instance I/O pin) in the good machine, and the object has a transition fault $F_1$ with a $T_{rise}$ transition delay, then in the good machine, the object will be scheduled to change state to logic '1' at:

$$t+T_{delta1}$$

Whereas the same object in the faulty machine $F_1$ will be scheduled to change state to logic '1' at:

$$t+T_{delta1}+T_{rise}$$

Similarly, if the driver of a signal or design instance I/O pin changes state from logic '1' or 'X' to logic '0' at simulation time t, and there is a falling delay of $T_{delta0}$ for that object in the good machine, and the object has a transition fault $F_1$ with a $T_{fall}$ transition delay, then in the good machine, the object will be scheduled to change state to logic '0' at:

$$t+T_{delta0}$$

Whereas the same object in the faulty machine $F_1$ will be scheduled to change state to logic '0' at:

$$t+T_{delta0}+T_{fall}$$

Note, the fanout logic of the signal or design instance I/O pin will be set to different logic states between the good machine and the faulty machine $F_1$ at each simulation time after t, and the fault $F_1$ will be detected by the fault simulator if the fanout logic includes one or more fault strobe nodes.

5.1.2 Inter-Process Communication (IPC) Faults

Deep submicron IC designs coded in ESL languages like SystemVerilog and/or SystemC may use IPC objects like semaphores, mutexes, mailboxes, FIFO's and/or dynamic queues. This is especially true if an IC design uses UVM (Universal Verification Methodology) or OVM (Open Verification Methodology) to construct its testbench. Each IPC object performs specific operations and the fault simulator an inject faults at those operations. The following sub-sections describe the IPC objects commonly used in ESL-based SoC designs, and the new IPC fault models that are supported by this invention.

5.1.2.1 Semaphore Fault Model

A semaphore is used to synchronize the execution of two or more processes in an IC design. A semaphore contains a natural number whose value may be increased or decreased by processes via the put or get (blocking)/tryget (non-blocking) methods, respectively. If a process executes the get (tryget) method on a semaphore which value is zero, the process will be blocked (will obtain a fail return status) until another process executes the put method on that semaphore.

A semaphore IPC fault may be specified in a fault configuration file via the SEMAPHORE fault record. The syntax of that record is:

SEMAPHORE [get/tryget/put] object_name$^+$;

Where object_name is one or more semaphore object full path names, delimited by a comma. User may specify get, tryget and/or put options in a SEMAPHORE fault record. If more than one option is specified, they are delimited by a comma. Each option specified instructs the fault simulator to disable the corresponding operation for the specified semaphore objects in faulty machines. For example:

SEMAPHORE tryget,put top.mod.sema1;

Will create a fault $F_x$ where the object top.mod.sema1 in the faulty machine for $F_x$ will have its tryget and put operations disabled. Thus, any process in the IC design that executes the tryget operation on top.mod.sema1 in the faulty machine for $F_x$ will get a failure return status. Similarly, any process in the IC design that executes the put operation on top.mod.sema1 in the faulty machine for $F_x$ will result in the semaphore's value is unchanged. Furthermore, if the above SEMAPHORE fault record includes the get option, then any process in the IC design that execute the get operation on top.mod.sema1 in the faulty machine for $F_x$ will be blocked indefinitely, as the get operation will never succeed.

If a fault configuration is not specified to the fault simulator, the simulator can automatically inject semaphore faults at all semaphore objects in the design database. Specifically, for each semaphore object, the fault simulator will inject three different faults: one fault for the get failure, one fault for the tryget failure, and one fault for the put failure.

5.1.2.2 Mutex Fault Model

A mutex is used to serialize the access of a global resource and/or the execution of a piece of HDL/ESL code by two or more processes in an IC design. A mutex contains a natural number whose value is either one or zero. A mutex value may be increased or decreased by processes via the unlock or lock (blocking)/trylock (non-blocking) methods, respectively. If a process executes the lock (trylock) method on a mutex which value is zero, the process will be blocked (will obtain a fail return status) until another process executes the unlock method on that mutex.

A mutex IPC fault may be specified in a fault configuration file via the MUTEX fault record. The syntax of that record is:

MUTEX [lock/trylock/unlock] object_name$^+$;

Where object_name is one or more mutex object full path names, delimited by a comma. User may specify lock, trylock and/or unlock options in a MUTEX fault record. If more than one option is specified, they are delimited by a comma. Each option specified instructs the fault simulator to disable the corresponding operation for the specified mutex objects in faulty machines. For example:

MUTEX trylock,unlock top.mod.mutx1;

Will create a fault $F_x$ where the object top.mod.mutx1 in the faulty machine for $F_x$ will have its trylock and unlock operations disabled. Thus, any process in the IC design that executes the trylock operation on top.mod.mutx1 in the faulty machine for $F_x$ will get a failure return status. Similarly, any process in the IC design that executes the unlock operation on top.mod.mutx1 in the faulty machine for $F_x$ will result in the mutex's value unchanged. Furthermore, if the above MUTEX fault record includes the lock option, then any process in the IC design that executes the lock operation on top.mod.mutx1 in the faulty machine for $F_x$ will be blocked indefinitely, as the lock operation will never succeed.

If a fault configuration is not specified to the fault simulator, the simulator can automatically inject mutex faults at all mutex objects in the design database. Specifically, for each semaphore object, the fault simulator will inject three different faults: one fault for the lock failure, one fault for the trylock failure, and one fault for the unlock failure.

5.1.2.3 FIFO and Mailbox Fault Model

A FIFO in SystemC (or a mailbox in SystemVerilog) is a first-in-first-out buffer that allows a process in a SoC design to be executed independently from another process, and still be able to send messages (simple data or a record of data) to another process in an orderly fashion. Specifically, data being "put" into a FIFO could be retrieved ("get") by a receiving process in the first-in-first-out manner.

A FIFO (or mailbox) IPC fault may be specified in a fault configuration file via the FIFO fault record. The syntax of that record is:

FIFO [get/tryget/put] object_name$^+$;

Where object_name is one or more FIFO object full path names, delimited by a comma. User may specify get, tryget and/or put options in a FIFO fault record. If more than one option is specified, they are delimited by a comma. Each option specified instructs the fault simulator to disable the corresponding operation for the specified FIFO objects in faulty machines. For example:

FIFO tryget,put top.mod.mb1;

Will create a fault $F_x$ where the object top.mod.mb1 in the faulty machine for $F_x$ will have its tryget and put operations disabled. Thus, any process in the IC design that executes the tryget operation on top.mod.mb1 in the faulty machine for $F_x$ will get a failure return status. Similarly, any process in the IC design that executes the put operation on top.mod.mb1 in the faulty machine for $F_x$ will result in no new data being put into the FIFO. Furthermore, if the above FIFO fault record includes the get option, then any process in the IC design that executes the get operation on top.mod.mb1 in the faulty machine for $F_x$ will be blocked indefinitely, as the get operation will never succeed.

If a fault configuration is not specified to the fault simulator, the simulator can automatically inject semaphore faults at all FIFO objects in the design database. Specifically, for each FIFO object, the fault simulator will inject three different faults: one fault for the get failure, one fault for the tryget failure, and one fault for the put failure.

5.1.2.4 Dynamic Queue Fault Model

A dynamic queue is like a one-dimensional array except its size is not fixed. A process may write to front, back, or at any location in a queue directly via the push_front, push_back, and insert methods, respectively. Another process may read data from any location in a dynamic queue directly and delete any entry in a dynamic queue via the delete method.

A dynamic queue IPC fault may be specified in a fault configuration file via the QUEUE fault record. The syntax of that record is:

QUEUE [push_front/push_back/insert/delete] object_name⁺;

Where object tame is one or more dynamic queue object full path names, delimited by a comma. User may specify push_front, push_back, insert and/or delete options in a QUEUE fault record. If more than one option is specified, they are delimited by a comma. Each option instructs the fault simulator to disable the corresponding operation for the specified dynamic queue objects in faulty machines. For example:

QUEUE push_front,insert,delete top.mod.qb1;

Will create a fault $F_x$ where the object top.mod.qb1 in the faulty machine for $F_x$ still have its push_front, insert and delete operations disabled. Thus, any process in the IC design that executes the push_front or insert operation on top.mod.qb1 in the faulty machine for $F_x$ will result in no new data is added to the object. Similarly, any process in the IC design that executes the delete operation on top.mod.qb1 in the faulty machine for $F_x$ will result in no data is being deleted from the object. The only legal operation to top.mod.qb1 in the faulty machine for $F_x$ is the push_back operation.

If a fault configuration is not specified to the fault simulator, the simulator can automatically inject dynamic queue faults at all dynamic queue objects in the design database. Specifically, for each dynamic queue object, the fault simulator will inject four different faults: one fault for the push_front failure, one fault for the push_back failure, one fault for the insert failure, and one fault for the delete failure.

5.2 Fault Collapsing Methods and Toggle Test

Faults generated for an IC design are collapsed based on equivalence and dominance fault collapsing methods. Specifically, equivalent faults and dominant faults in an IC design are collapsed as follows:

Stuck-at-0 faults at the input pins of an AND gate will be collapsed by the AND gate's output pin stuck-at-0 fault.
Stuck-at-1 faults at the input pins of an AND gate will collapse the AND gate's output pin stuck-at-1 fault.
Stuck-at-1 faults at the input pins of an OR gate will be collapsed by the OR gate's output pin stuck-at-1 fault.
Stuck-at-0 faults at the input pins of an OR gate will collapse the OR gate's output pin stuck-at-0 fault.
Stuck-at-0 faults at the input pins of an NAND gate will be collapsed by the NAND gate's output pin stuck-at-1 fault.
Stuck-at-1 faults at the input pins of an NAND gate will collapse the NAND gate's output pin stuck-at-0 fault.
Stuck-at-1 faults at the input pins of an NOR gate will be collapsed by the NOR gate's output pin stuck-at-0 fault.
Stuck-at-0 faults at the input pins of an NOR gate will collapse the NOR gate's output pin stuck-at-1 fault.
Stuck-at-1 faults at the input pins of an INV gate will be collapsed by the INV gate's output pin stuck-at-0 fault.
Stuck-at-0 faults at the input pins of an INV gate will be collapsed by the INV gate's output pin stuck-at-1 fault.
Stuck-at-1 faults at the input pins of a BUF gate will be collapsed by the INV gate's output pin stuck-at-1 fault.
Stuck-at-0 faults at the input pins of a BUF gate will be collapsed by the INV gate's output pin stuck-at-0 fault.

Furthermore, as a user-specified option, the fault simulator can run toggle test on the IC design under test. In toggle test the fault simulator runs logic simulation of the IC design using user-supplied test vectors. During logic simulation, signals that change states from logic '0' or 'X' to logic '1' will be tagged as toggled-to-1, and signals that change states from logic '1' or 'X' to logic '0' will be tagged as toggled-to-0. After the toggle test simulation is completed, stuck-at-1 faults at signals that have not been tagged as toggled-to-0 will be marked as undetectable (in the fault dictionary). Furthermore, transition faults at those signals will be marked with falling transition undetectable. Similarly, stuck-at-0 faults at signals that have not been tagged as toggled-to-1 will be marked undetectable (in the fault dictionary), and transition faults at those signals will be marked with rising transition undetectable.

5.3 Fault Partitioning

As another aspect of the invention, all un-collapsed faults of an IC design under test are recorded in the fault dictionary, and they are partitioned by the fault simulator into disjointed fault sets. The method of fault partitioning is:

The fault simulator traces forward from each input port of the IC design, and collects all faults in the fanout logic cone of that input port into a fault set. The logic cone is terminates at the IC design output and inout ports, and/or at D-flip flop instances' input (data, set, reset, clock) pins.

The fault simulator traces forward from each DFF instance output pin and collects all faults in the fanout logic cone of that output pin into a fault set. The logic cone terminates at the IC design output and inout ports, and DFF instances' input pins.

Figure 3:
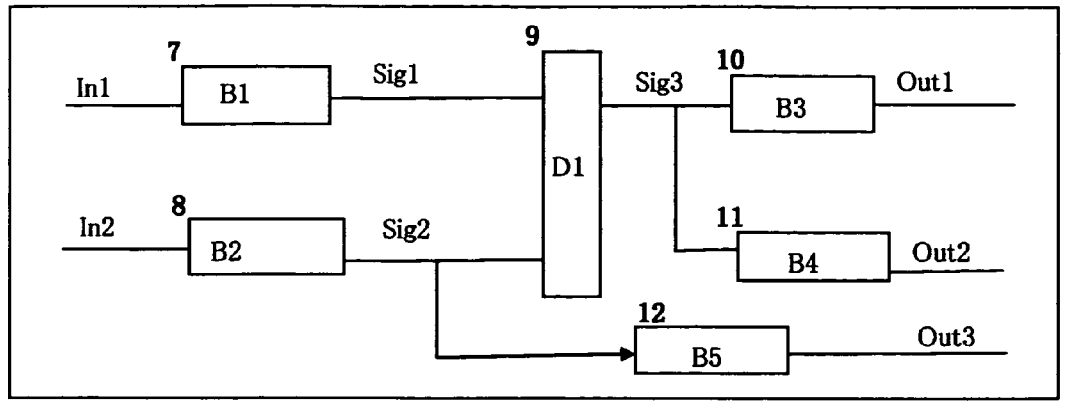
FIG. 3 shows the partitioning of user-defined faults in an IC design into disjointed fault sets based on the fanout logic cone of primary input ports and DFF's Q output pin of the IC design.

Refer to FIG. 3 for a sample IC circuit, the following fault sets could be generated based on the aforementioned partitioning method:

Fault set 1: stuck-at and transition faults at in1 and Sig1.
Fault set 2: stuck-at and transition faults at in2, Sig2 and Out3. Input stuck-at and transition faults at D1 box 9 and B5 box 12.
Fault set 3: stuck-at and transition faults at Sig3, Out1 and Out2. Input stuck-at and transition faults at B3 box 10 and B4 box 11.

5.4 Concurrent Fault Simulation Algorithm

The fault simulator compiles an IC design source files into a common design database, where the IC design is represented by a directed graph of objects connected by signals and input/output ports. Fugue 3 shows an example of an IC design database. Note that signals can be single-bit or multi-bits. Objects (e.g., B1, B2, D1, etc. in FIG. 3) can be simple logic gates like AND, OR. XOR, INV, etc., RTL (register transfer level) process, always or initial blocks, SystemVerilog assertion, coverage monitoring blocks or SystemC/SystemVerilog inter-process communication (IPC) objects (mutexes, semaphores, FIFO's, dynamic queues) etc.

Figure 4:
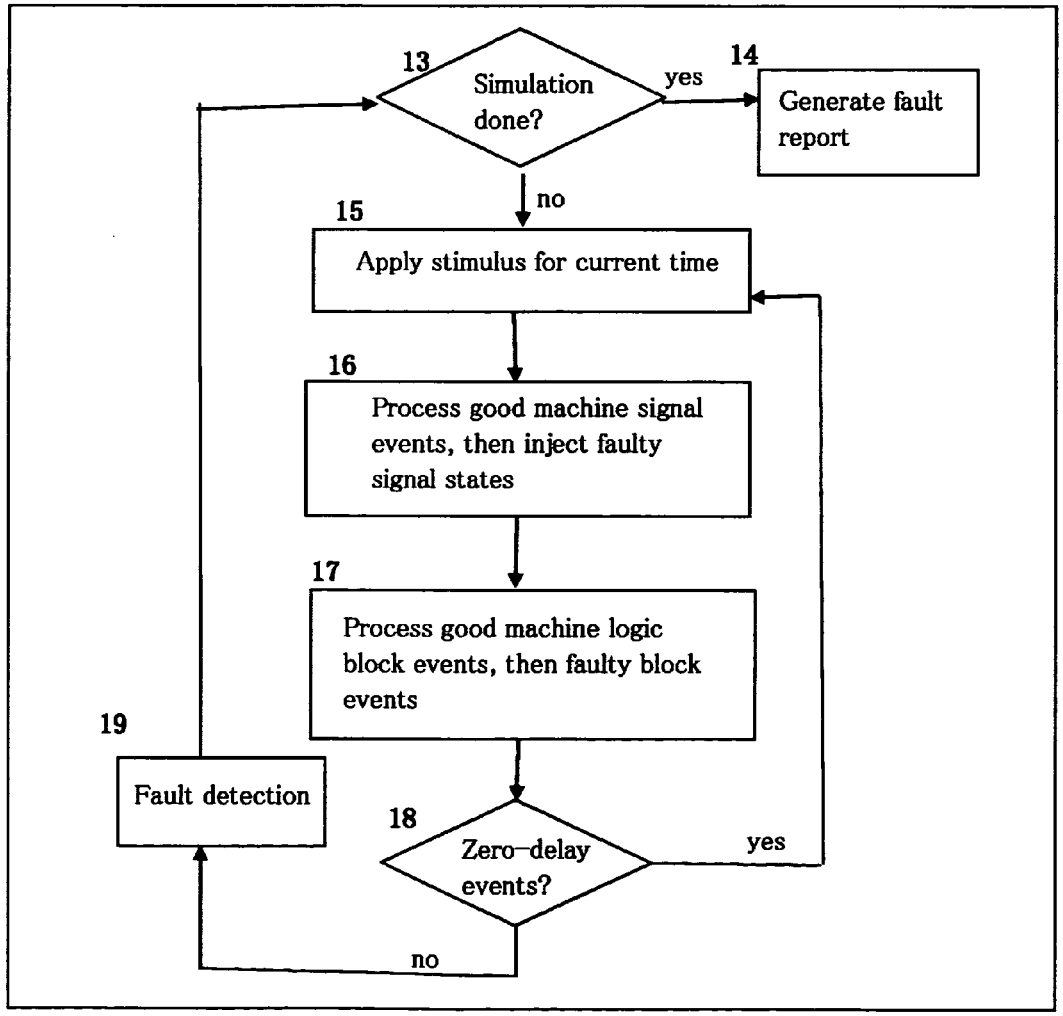
FIG. 4 depicts the process flow of the concurrent fault simulation of an IC design

FIG. 4 depicts a concurrent fault simulation algorithm. A concurrent fault simulator carries out an event-driven logic simulation of an IC design, using user-supplied test vectors. Furthermore, the fault simulator simulates all faults of the IC design concurrently during the logic simulation process, so as to speedup the fault simulator performance. Specifically, at each simulation cycle, the input stimulus for the IC design under test at the current simulation time is applied to the circuit in step 15, and signals' states are updated in step 16. Each signal may carry a list of fault records for faults that have different signal states than that of the good machine. Specifically, each fault record contains these data:

Fault ID
Faulty signal state

After signals are updated, logic blocks in good machine and their corresponding faulty machines are evaluated in step 17. If the evaluation of logic blocks causes new zero-delay events in step 18, either for the good machine or faulty machines, the signal update process and logic block events processing (step 16 and step 17) are repeated. If there is no zero-delay event, the fault simulator will perform fault detection at user-specified fault strobe nodes in step 19. After that, the fault simulator will advance the simulation time to the next event time in step 13, and the fault simulator will halt the simulation if any of the following conditions is met:

There is no more simulation event (for both good and faulty machines).

All injected faults are hard detected.

The current simulation time exceeds the user-specified maximum simulation time.

Once the simulation is completed, the fault simulator will generate a fault report file in step 14, and then terminates the program.

FIG. 5 illustrates how faults are processed by the fault simulator. Specifically, FIG. 5 depicts a sample design instance top.p1.inst1 20 driven by two signals In1 and In2, and the instance output pin drives the signal Q. Note that for the signal In1, it contains two faulty state records: for fault ID 1 21 and fault ID 3 22, and the in1 signal state in the good machine is logic '1'.

For the signal In2, it contains one faulty state record: for fault ID 5 23, and in2 signal state in the good machine is logic '0'. For signal Q, it contains one faulty state record: for fault ID 2 24, and Q signal state in the good machine is logic '0'.

Thus during fault simulation, whenever in1 or in2 in the good machine changes state, the instance top.p1.inst1 is evaluated based on the latest good machine in1 and in2 values, and the output signal Q's value may be updated due to the evaluation.

After the good machine instance has been evaluated, each faulty state record of the instance is examined to create a corresponding faulty instance, and the faulty instance will be evaluated by the fault simulator to determine the faulty instance's output signal Q's state is different than that of the good machine, and a new fault records are added to the signal Q's fault record list accordingly. On the other hand, if the evaluation of a faulty instance result in the faulty instance's Q state is the same as that in the good machine, then the corresponding fault will be removed (if it is present) from the Q's fault record list.

For the design instance top.p1.inst1 as depicted in FIG. 5, assuming it is an AND gate, the corresponding faulty instances and their input/output states, as created by the fault simulator, are shown below:

| Fault ID | In1 | In2 | Q |
|---|---|---|---|
| good machine | 1 | 0 | 0 |
| 1 | 0 | 0 | 0 |
| 2 | 1 | 0 | 0 |
| 3 | X | 0 | 0 |
| 5 | 1 | 1 | 1 |

Thus, after the good and faulty machines for instance top.p1.inst1 are evaluated, the output signal Q will have only one fault record, fault ID 5, in its fault record list.

5.5 Multithreaded Concurrent Fault Simulation

FIG. 1 depicts a multithreaded concurrent fault simulation process flow. The HDL/ESL source files of an IC design under test are compiled by the fault simulator into a design database in step 1. Specifically, the IC design source files may be coded in any HDL/ESL languages, including but not limited to VHDL, Verilog, SystemVerilog, PSL and/or SystemC. The fault simulator will compile these source files into a common design database, and it will resolve any signal name conflicts and logic state mapping issues due to the use of plurality of design languages. These are accomplished by mapping VHDL logic states to Verilog logic states, and converting all object_names in the design database to upper or lower cases, so as to ensure object_name references in all design files are case-insensitive.

After the design database is constructed, single stuck-at and/or transition faults are generated for the IC design in step 2, either via a user-specified fault configuration file or automatically generated by the fault simulator. If a fault configuration file is specified to the fault simulation, the simulator will generate single stuck-at-1, stuck-at-0 and/or transition faults at specified design objects as according to the file. On the other hand, if no fault configuration file is specified, the fault simulator will generate single stuck-at-1, stuck-at-0 and transition faults (with rising and falling transition delays set to 1 time step) for all signals in the design database. The generated faults are collapsed via equivalence and dominance fault collapsing methods as described in Section 5.2. The remaining faults are recorded in a fault dictionary.

Moreover, as a user-specified option, the fault simulator could run toggle test in step 3 to further collapse faults at un-toggled circuit signals. The fault collapsing method via toggle test is also described in Section 5.2.

After faults are collapsed, the remaining faults are injected into the IC design database. Furthermore, the fault simulator partitions those faults into disjointed fault sets in step 4. The fault partitioning method is depicted in Section 5.3.

The fault simulator next creates a plurality of worker processes (or threads) in step 5 to process the fault sets concurrently. Specifically, if there are N fault sets generated, then j worker processes could be created, where:

$$1<=J<=N$$

Let M be r the number of available CPU's of the computer that the fault simulator is run on. J is either user-specified, or it is automatically set by the fault simulator to be either N or M, whichever is of lesser value. If J (UNIX) processes are created, these processes can run locally on a multiprocessor computer, or they can be distributed to run separately on a set of remote computers that are connected by either an intranet or the Internet. Each process will have a copy of the design database, fault dictionary, private heap memory, and simulation event queue. However, if J (POSIX) threads are created instead, these threads will only run on a multiprocessor computer, and they could share a global design database and a global fault dictionary. However, the fault simulator will need to allocate private heap memory and event queue for each thread, and the accessing of the global IC design database and fault dictionary by multiple threads will need to be synchronized to ensure correct simulation results.

Each worker process (or thread) is assigned one or more fault sets and will run concurrent fault simulation of the IC design with those fault sets and using user-supplied test vectors. The concurrent fault simulation method is described in Section 5.4. To further speedup the fault simulator performance, prior to running fault simulation, each worker process will spawn T child threads to carry out the evaluation of faulty design instances concurrently. The T value is either user-specified, or it is set to J by default.

The T child threads are created in each worker process prior to start of fault simulation. Each child thread is allocated a private heap memory to minimize the synchronization overhead when multiple child threads allocate and/or free heap memory at the same time. Furthermore, the T child threads are blocked from execution at the beginning of fault simulation. Then at each simulation cycle, every time a good machine design instance is evaluated, T2 child threads will be unblocked to evaluate all faulty instances of that design instance Let:
S=Total number of faulty instances to be processed
W=Minimum workload of a thread Then T2 is determined as:

$$T2 = (S/W) > T ? T : (S/W)$$

where W is the minimum number of faulty instances that each child thread needs to process to justify the use of the child threads. This is to ensure the performance gain by using multiple child threads in fault evaluation will outweighs the synchronization overhead incurred by using them. We have chosen W is greater than or equal to two.

If T2 is 1, the worker process will evaluate all the faulty instances itself. Thus, our technologies dynamically adjust the number of child threads being used throughout the fault simulation to achieve best performance for the fault simulator.

As an example, referring to FIG. 5, once a good machine instance is evaluated, the construction and evaluation of its faulty instances could be executed in parallel by T2 child threads. Each child thread will construct and evaluate S/T2 faulty instances. Any fault detected by the child threads are recorded in the worker process private fault dictionary.

Once all worker processes complete their execution, their fault dictionaries are combined into a master fault dictionary, and the overall fault simulation results will be written to a fault report file in step 6.

TABLE 3

V2Fault ™ Benchmark Results (in CPU second)

| Circuit | No. Stuck-at-fault | No. Transition faults | 1-CPU | 2-CPU | 4-CPU | 8-CPU |
|---|---|---|---|---|---|---|
| MoSoC | 2356700 | 514500 | 351000 | 167010 | 121200 | 65610 |
| SoC29K | 1635100 | 213910 | 114010 | 62500 | 41010 | 21300 |
| RISC128 | 1823056 | 386904 | 274200 | 13800 | 75100 | 36150 |
| TLM-X | 3045689 | 823567 | 651410 | 32172 | 16350 | 8312 |
| SoC68K | 4433323 | 972911 | 839520 | 57950 | 29305 | 16350 |

Table 3 depicts the experimental results of V2Fault™, a multithreaded concurrent fault simulator that was developed based on the invention technologies, on a set of deep submicron large-scale SoC, ASIC, FPGA and custom IC designs. Each design contains several billions of transistors, has multiple clocks, and is either a synchronous or asynchronous circuit. Note that V2Fault™ worker processes were implemented using UNIX processes, and the tests depicted in Table 3 were run on a Linux workstation, with 8 gigabyte of memory and an Intel Corporation 8-core microprocessor chip. The results shown in Table 3 demonstrate V2Fault™ performance scales according to the number of CPU's available for fault simulation.

5.5.1 Garbage Collection

When a worker process runs out of heap memory while performing multithreaded concurrent fault simulation of its assigned fault sets, it will examine all currently simulated faults and identify the top 10% faults that are consuming the most memory. Those faults will be discarded from the current simulation, and they are moved to a new fault set. Moreover, the memory used by those faults will be re-claimed into the heap memory pool. After all that, the worker process will resume the fault simulation of the remaining un-discarded faults.

Once a worker process has completed fault simulation of its assigned fault sets, it will be assigned any new fault sets that are generated by any worker processes due to garbage collection. A worker process has completed its execution when it has finished fault simulation of its assigned fault sets, and there is no more new fault sets for the worker process to work on.

5.6 Fault Report

FIG. 6 depicts a sample fault report file for an IC design under test. The fault report file depicts the following information:

The IC design top module name
submicron large-scale SoC, ASIC, FPGA and custom IC designs. Each design contains several billions of transistors, has multiple clocks, and is either a synchronous or asynchronous circuit. Note that V2Fault™ worker processes were implemented using UNIX processes, and the tests depicted in Table 4 were run on a Linux workstation, with 8 gigabyte of memory and an Intel Corporation 8-core microprocessor chip. The results shown in Table 4 demonstrate V2Fault™ performance scales according to the number of CPU's available for fault simulation.

5.5.1 Garbage Collection

When a worker process runs out of heap memory while performing multithreaded concurrent fault simulation of its assigned fault sets, it will examine all currently simulated faults and identify the top 10% faults that are consuming the most memory. Those faults will be discarded from the current simulation, and they are moved to a new fault set. Moreover, the memory used by those faults will be re-claimed into the heap memory pool. After all that, the worker process will resume the fault simulation of the remaining un-discarded faults.

Once a worker process has completed fault simulation of its assigned fault sets, it will be assigned any new fault sets that are generated by any worker processes due to garbage collection. A worker process has completed its execution when it has finished fault simulation of its assigned fault sets, and there is no more new fault sets for the worker process to work on.

5.6 Fault Report

FIG. 6 depicts a sample fault report file for an IC design under test. The fault report file depicts the following information:

The IC design top module name
Total number of signals in the design
Total number of signals toggled to logic '1'
Total number of signals toggled to logic '0'
Total number of stuck-at-1 faults injected
Total number of stuck-at-0 faults injected
Total number of transition faults injected
Total number of stuck-at-1 faults suppressed by fault collapsing
Total number of stuck-at-0 faults suppressed by fault collapsing
Total number of transition faults suppressed by fault collapsing
Total number of faults injected and simulated
Total number of faults detected
Total fault coverage
List of undetected faults Note the total number of stuck-at-1 (0) faults generated for an IC design is the sum of the total number of stuck-at-1 (0) faults injected and the total number of stuck-at-1 (0) faults collapsed. Similarly, the total number of transition faults generated is the sum of the total number of transition faults injected and the total number of transition faults collapsed.

The fault coverage is computed based on the total number of faults injected (stuck-at-1, stuck-at-0 and transition faults) and the total number of those (injected) faults that are hard detected.

The fault report may also include the total number of potentially detected faults, and the fault coverage could be specified as a range:
From: Total hard detected faults/Total injected faults
To: (Total hard+potentially detected faults)/Total injected faults
For example, if the total number of faults injected is 6125, 5412 faults are hard detected, and 241 faults are potentially detected, then the fault coverage could be specified as
    88.36% to 92.3%
where:

100%*5412/6125=88.36%

100%*(5412+241)/6125=92.3%

Furthermore, the fault report file may also show a list of potentially detected faults, and a tally of how many clock cycles each potentially detected fault is potentially detected.

Moreover, the fault simulator may also report, either in the fault report file or in a separate file, a list of collapsed faults, and an indication per fault that depicts the fault is collapsed based on equivalence fault collapsing, dominance fault collapsing or via toggle test.

Finally, as a user-specified option, the fault simulator may report, either in the fault report file or in a separate file, a list of all generated faults, and for each fault, an indication that the fault was hard detected, potentially detected, undetectable, or collapsed.

The specification describes a preferred embodiment of the invention. It should be understood than this is an exemplary of the invention and is not to be considered as limiting. Additions, deletions, substitutions and other modifications can be made without departing from the spirit or scope of the present invention. Accordingly, the invention is not to be considered as limited by the specification, but is only limited by the scope of the appended claims.

I claim:

1. A set of computer implemented methods of performing a multithreaded concurrent fault simulation of an integrated circuit (IC) design, represented by at least one of a plurality of hardware description languages ("HDLs") or electronic system-level languages ("ESLs"), including VHDL, Verilog, SystemVerilog, Property Specification Language (PSL), SystemC languages or a mixture thereof, on a general purpose multiprocessor platform, comprising:
   (a) Pre-examining each user-specified HDL/ESL source file and invoking an appropriate HDL/ESL compiler from a group of compilers to compile a design source file into a common design database;
   (b) Resolving any design object names conflict and signal states incompatibility in the design source files due to use of a plurality of HDL/ESL languages to ensure correct modeling and simulation of the integrated circuit design; and
   (c) Optionally obtaining a maximum number of CPU's to use from users, and creating a plurality of worker threads based on the maximum number of CPU's available on the multiprocessor computer platform or per user-specification and wherein the worker thread carry out a multithreaded concurrent fault simulation of the IC design with a fault simulator on multiprocessor platform; and
   (d) Performing the multithreaded concurrent fault simulation.

2. The method of performing a multithreaded concurrent fault simulation according to claim 1 step (b) wherein resolving design object names conflict further comprises providing a program switch for the user to instruct a simulator's HDL/ESL compiler to use VHDL-style, case-insensitive object naming convention for all design object names.

3. The method of performing a multithreaded concurrent fault simulation according to claim 1 step (b) further comprising automatically mapping VHDL, PSL and SystemC logic states to Verilog/SystemVerilog logic states to ensure accuracy of simulation of mixed-language IC design.

4. The method of performing a multithreaded concurrent fault simulation according to claim 1 further comprising supporting an optional user-specified fault configuration file that specifies one or more of the following data:
   (e) A single stuck-at, transition or inter-process communication (IPC) faults to be generated for the IC design;
   (f) A set of fault strobe node names, where fault detection in the IC design takes place during the simulation.

5. The method of performing a multithreaded concurrent fault simulation according to claim 1 wherein the step of (c) further comprises:
   (g) Creating a master fault set based on either a user-supplied fault configuration file or automatically generated by a fault simulator;
   (h) Collapsing the master fault set based on equivalence and dominance fault collapsing methods;
   (i) As a user-specified option, running toggle test on the IC design and collapsing faults on un-toggled design signals;
   (j) Recording all remaining faults in a fault dictionary and injecting the faults into an IC design database, and partitioning the faults into disjointed fault sets;
   (k) Creating a plurality of worker threads, and assigning one or more fault sets to each worker thread;
   (l) Creating as a user option a specified number of child threads in each worker thread to carry out the multithreaded concurrent fault simulation of the assigned fault sets;
   (m) Generating a fault report file after all threads have completed the multithreaded fault simulation of the fault sets.

6. The method of performing a multithreaded concurrent fault simulation according to claim 5, wherein step (k) further comprises allocating a private a heap memory region, an event queue and a fault dictionary for each worker thread, prior to a start of fault simulation.

7. The method of performing a multithreaded concurrent fault simulation according to claim 5, wherein step (g) further comprises generating faults for the IC design, either based on a user-specified fault configuration file if such file is specified to the fault simulator, or the fault simulator automatically generates the faults at all design signals and objects in the IC design.

8. The method of claim 7 wherein the faults generated for the IC design include one or more of: single stuck-at-1, stuck-at-0, transition or IPC faults.

9. The method of performing a multithreaded concurrent fault simulation according to claim 5, wherein step (h) further comprises collapsing generated faults for the IC design using equivalence and dominance fault collapsing methods, to reduce a total number of faults to be simulated.

10. The method of performing a multithreaded concurrent fault simulation according to claim 5, wherein step (i) further comprises supporting a user-specified option to run toggle test on the IC design, using user-supplied test vectors, and collapsing stuck-at-0 and stuck-at-1 faults on all untoggled-to-1 and untoggled-to-0 IC design signals respectively.

11. The method of claim 10 further comprising collapsing rising and falling transition faults at untoggled-to-1 and untoggled-to-0 IC design signals.

12. The method of performing a multithreaded concurrent fault simulation according to claim 5, wherein step (j) further comprises partitioning all un-collapsed faults into disjointed fault sets, wherein all un-collapsed faults in a fanout logic cone of each IC design primary input or in/out port are collected into the fault set, and all un-collapsed faults in the fanout logic cone of each D-flip flop output pin are collected into the fault set.

13. The method of performing a multithreaded concurrent fault simulation according to claim 5, wherein step (k) further comprises creating a plurality of worker threads, and assigning each of them one of more fault sets to carrying out multithreaded concurrent fault simulation for the fault sets.

14. The method of performing a multithreaded concurrent fault simulation according to claim 13 wherein the worker threads are run either locally on the multiprocessor platform or remotely on a set of computers connected by an intranet (local area network) or the Internet.

15. The method of performing a multithreaded concurrent fault simulation according to claim 13 wherein each worker thread has a copy of an IC design database if it is running on a remote computer; otherwise all worker threads either have their own copy of the IC design database or they share an IC design database if they are running locally on the multiprocessor platform.

16. The method of performing a multithreaded concurrent fault simulation according to claim 5 step (l) further comprising creating a plurality of child threads for each worker thread, wherein the worker thread and child threads carry out the multithreaded concurrent fault simulation of all assigned faults of each worker thread.

17. The method of performing a multithreaded concurrent fault simulation according to claim 16 wherein each child thread is allocated a private heap memory region to maximize concurrency and minimize threads synchronization overhead.

18. The method of performing a multithreaded concurrent fault simulation according to claim 16 further comprising blocking all child threads in a worker thread from running at start of simulation; and during simulation, at each simulation time point, dynamically computing a minimum number of child threads needed by each worker thread, and when activated by the worker thread, the child threads simulate different faulty instances of each design instance concurrently.

19. The method of performing a multithreaded concurrent fault simulation according to claim 18 wherein the worker thread evaluates faults associated with a design instance if a design instance has fewer faults than a user specified number or a number of microprocessors (CPU's) available to the simulator.

20. The method of performing a multithreaded concurrent fault simulation according to claim 5, wherein step (m) further comprises generating a fault report file, after all the threads have completed a simulation of assigned faults.

21. A set of computer implemented methods of performing a multithreaded concurrent fault simulation of an integrated circuit (IC) design, represented by at least one of a plurality of hardware description languages ("HDLs") or electronic system-level languages ("ESLs"), including VHDL, Verilog, SystemVerilog, Property Specification Language (PSL), SystemC languages or a mixture thereof, on a general purpose multiprocessor platform, comprising:

(a) Pre-examining each user-specified HDL/ESL source file and automatically invoking an appropriate HDL/ESL compiler from a group of compilers to compile a design source file into a common design database;
(b) Resolving any design object names conflict and signal states incompatibility in the design source files due to use of a plurality of HDL/ESL languages to ensure correct modeling and simulation of the integrated circuit design; and
(c) Optionally obtaining a maximum number of CPU's to use from users, and creating a plurality of worker threads based on the maximum number of CPU's available on the multiprocessor platform or per user-specification and wherein worker threads carry out a multithreaded concurrent fault simulation of the IC design with a fault simulator on multiprocessor platforms;
(d) Performing a multithreaded concurrent fault simulation; and
(e) performing garbage collection when a worker thread runs out of heap memory while performing concurrent fault simulation, wherein the garbage collection finds faults consuming the most memory in the worker thread, moving the faults into a new fault list, reclaiming all memory used by the faults, and continuing fault simulation of the remaining faults.

22. The method of performing a multithreaded concurrent fault simulation according to claim 21 further comprising performing a new fault simulation run on any new fault sets that are generated due to garbage collection by any worker threads after each worker thread has completed fault simulation of its assigned fault sets.

23. The method of performing a multithreaded concurrent fault simulation according to claim 1 step (c) further comprising supporting transition faults where faulty design signals propagate their signal states with different rising or falling delays, as specified by users, than that of corresponding fault-free machine design signals.

24. A set of computer implemented methods of performing a multithreaded concurrent fault simulation of an integrated circuit (IC) design, represented by at least one of a plurality of hardware description languages ("HDLs") or electronic system-level languages ("ESLs"), including VHDL, Verilog, SystemVerilog, Property Specification Language (PSL), SystemC languages, or a mixture thereof, on a general purpose multiprocessor platform, comprising:

(a) Pre-examining each user-specified HDL/ESL source file and automatically invoking an appropriate HDL/ESL compiler from a group of compilers to compile a design source file into a common design database;
(b) Resolving any design object names conflict and signal states incompatibility in the design source files due to use of a plurality of HDL/ESL languages to ensure correct modeling and simulation of the integrated circuit design; and
(c) Optionally obtaining a maximum number of CPU's to use from users, and creating a plurality of worker threads based on the maximum number of CPU's available on the multiprocessor platform or per user-specification and wherein worker threads carry out a multithreaded concurrent fault simulation of the IC design with a fault simulator on multiprocessor platforms;
(d) Performing a multithreaded concurrent fault simulation; and wherein step (c) further comprises supporting IPC faults where faulty IPC design objects including semaphores, mutually exclusive locks (mutexes), FIFO's, mailboxes, or dynamic queues having one or more operations disabled in faulty machines.

25. The method of performing a multithreaded concurrent fault simulation according to claim 24 wherein the fault simulator generates, either automatically or per user specification, IPC faults for each IPC object found in a design database, where a fault is created for each operation failure for an IPC object-based on its IPC object type.

26. The method of performing a multithreaded concurrent fault simulation according to claim 25 wherein the fault simulator generates three faults for a FIFO or mailbox object, one for a get operation fault, one for a tryget operation fault and one for a put operation fault.

27. The method of performing a multithreaded concurrent fault simulation according to claim 25 further wherein the fault simulator generates three faults for a mutex object, one for a lock operation fault, one for a trylock operation fault and one for an unlock operation fault.

28. The method of performing a multithreaded concurrent fault simulation according to claim 25 wherein the fault simulator generates three faults for a semaphore object, one for a get operation fault, one for a tryget operation fault and one for a put operation fault.

29. The method of performing a multithreaded concurrent fault simulation according to claim 25 wherein the fault simulator generates four faults for a dynamic queue object: for a push_front operation fault, one for a push_back operation fault, one for an insert operation fault and one for a delete operation.

* * * * *